(12) United States Patent
Quilligan et al.

(10) Patent No.: US 9,685,913 B2
(45) Date of Patent: Jun. 20, 2017

(54) AUTO-ZERO DIFFERENTIAL AMPLIFIER

(71) Applicant: The United States of America as represented by the Administrator of the National Aeronautics and Space Administration, Washington, DC (US)

(72) Inventors: Gerard T. Quilligan, Gulf Breeze, FL (US); Shahid Aslam, Washington, DC (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/850,602

(22) Filed: Sep. 10, 2015

(65) Prior Publication Data

US 2017/0077876 A1    Mar. 16, 2017

(51) Int. Cl.
    *H03F 1/02*    (2006.01)
    *H03F 1/26*    (2006.01)
    *H03F 3/45*    (2006.01)

(52) U.S. Cl.
    CPC ........... *H03F 1/26* (2013.01); *H03F 3/45076* (2013.01); *H03F 2203/45116* (2013.01); *H03F 2203/45152* (2013.01)

(58) Field of Classification Search
    CPC .... H03F 1/02; H03F 3/45; H03F 2203/45116; H03F 2203/45152
    USPC ...................... 330/9, 259, 260; 327/124, 307
    See application file for complete search history.

(56) References Cited

U.S. PATENT DOCUMENTS

2011/0187436 A1*    8/2011    Saito ...................... G06G 7/18
                                                             327/345

\* cited by examiner

*Primary Examiner* — Steven J Mottola

(57) ABSTRACT

An autozero amplifier may include a window comparator network to monitor an output offset of a differential amplifier. The autozero amplifier may also include an integrator to receive a signal from a latched window comparator network, and send an adjustment signal back to the differential amplifier to reduce an offset of the differential amplifier.

19 Claims, 3 Drawing Sheets

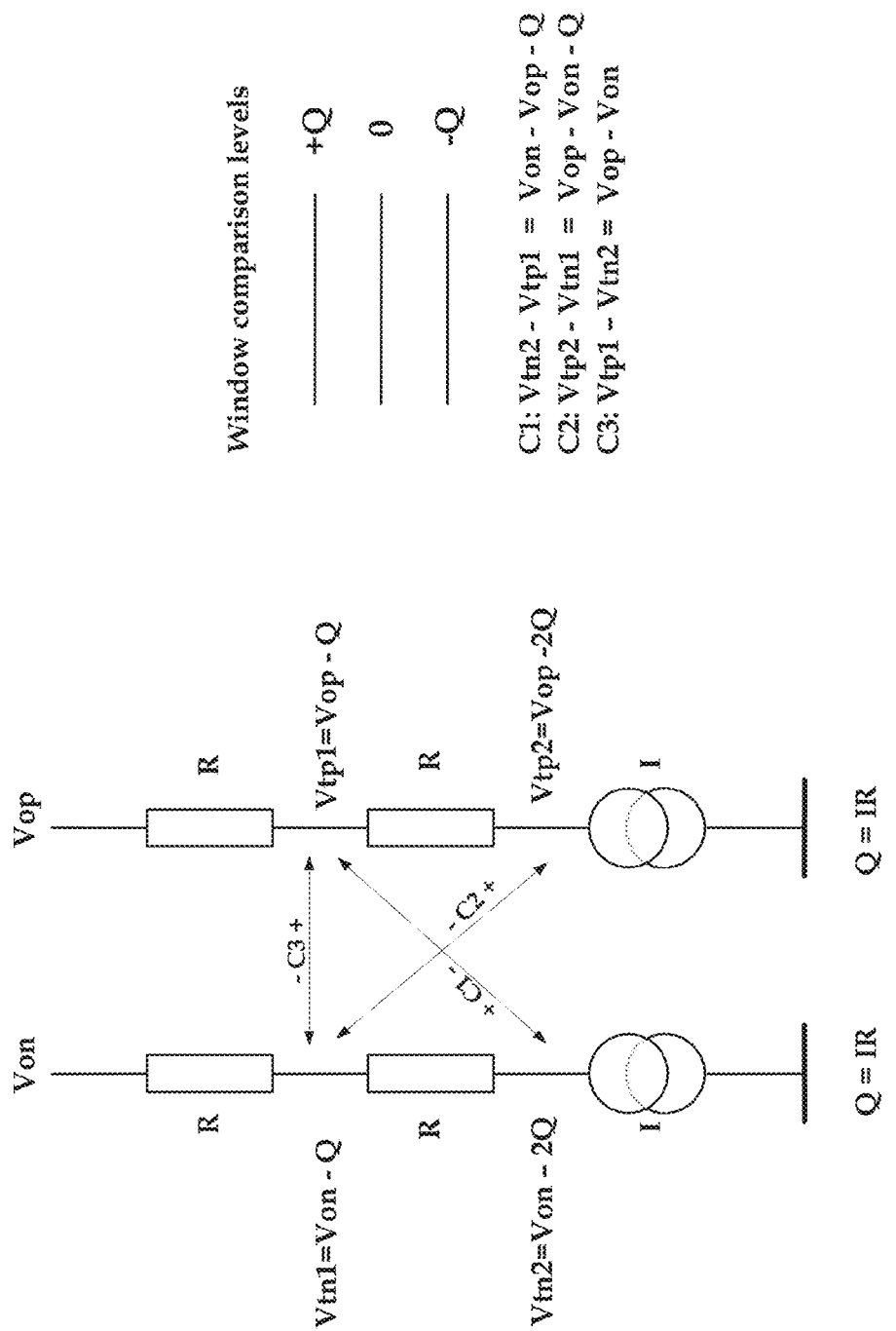

AUTO-ZERO DIFFERENTIAL AMPLIFIER

STATEMENT OF FEDERAL RIGHTS

The invention described herein was made by employees of the United States Government and may be manufactured and used by or for the Government for Government purposes without the payment of any royalties thereon or therefore.

FIELD

The present invention generally relates to automatic offset reduction in a monolithic differential amplifier, and more particularly, to automatic offset reduction in an monolithic differential amplifier utilizing one or more clock signals such as a chopper stabilized differential amplifier for amplification with low offset and 1/f noise.

BACKGROUND

Microvolt level signals often need to be amplified with large gains before they can be digitized by an analog to digital converter (ADC). In the presence of high amplifier gain needed to amplify the microvolt level signals, the amplified offset can be so large as to force the amplifier output to reach a minimum or maximum level where it is no longer responsive to the input signal. For complementary metal-oxide semiconductor (CMOS) circuits built in modern integrated circuit processes and operating in low radiation environments, amplifier offsets can be kept reasonably small without auto-zeroing. However, if the circuit were to accumulate sufficient amounts of ionizing radiation dose, the circuit's offset could increase significantly due to changes in the CMOS transistor threshold voltages. Space based instruments can be exposed to extreme radiation such as exists in the Jovian orbital system, accumulating ionizing doses in excess of 3 Mrad (Si). Amplifier offsets can thus vary by at least several millivolts from an ideally near zero voltage design point and eventually cause amplifier saturation.

Chopper stabilization is an established method for reducing the offset and 1/f noise of an amplifier. On its own, the technique is effective as long as the amplifier output is not saturated which can occur if the both the amplifier gain and its offset are large. Thus chopper stabilization techniques of and by themselves may not be sufficient to reduce amplifier offset at high gains. Therefore, an adaptive technique must be employed.

SUMMARY

Certain embodiments of the present invention may provide solutions to the problems and needs in the art that have not yet been fully identified, appreciated, or solved by conventional techniques. For example, some embodiments of the present invention pertain to AZDA to reduce the offset of a differential amplifier in a negative feedback process (or loop).

In an embodiment, an apparatus includes a latched window comparator network that monitors an output offset of a differential amplifier. The apparatus also includes an integrator that receives signals from the latched window comparator network, and sends an adjustment signal back to the differential amplifier to reduce an offset of the differential amplifier.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which:

FIG. 3 illustrates an auto-zero window comparator principle, according to an embodiment of the present invention.

DETAILED DESCRIPTION OF THE EMBODIMENTS

Some embodiments of the present invention pertain to an AZDA that amplifies very small amplitude signals emanating from sensors such as a thermopile. Both the sensor and the AZDA circuit may also be located in a high total ionizing dose (TID) environment such as found in certain regions of the Solar System or near a radioisotope where the ionizing dose can change an amplifier's offset over time.

In some embodiments, since the AZDA is self-adjusting, the AZDA can also correct for offset shifts caused by TID. In other words, the AZDA may allow radiation-hardened amplifiers to be built with low offset and low 1/f noise.

Figure 1:
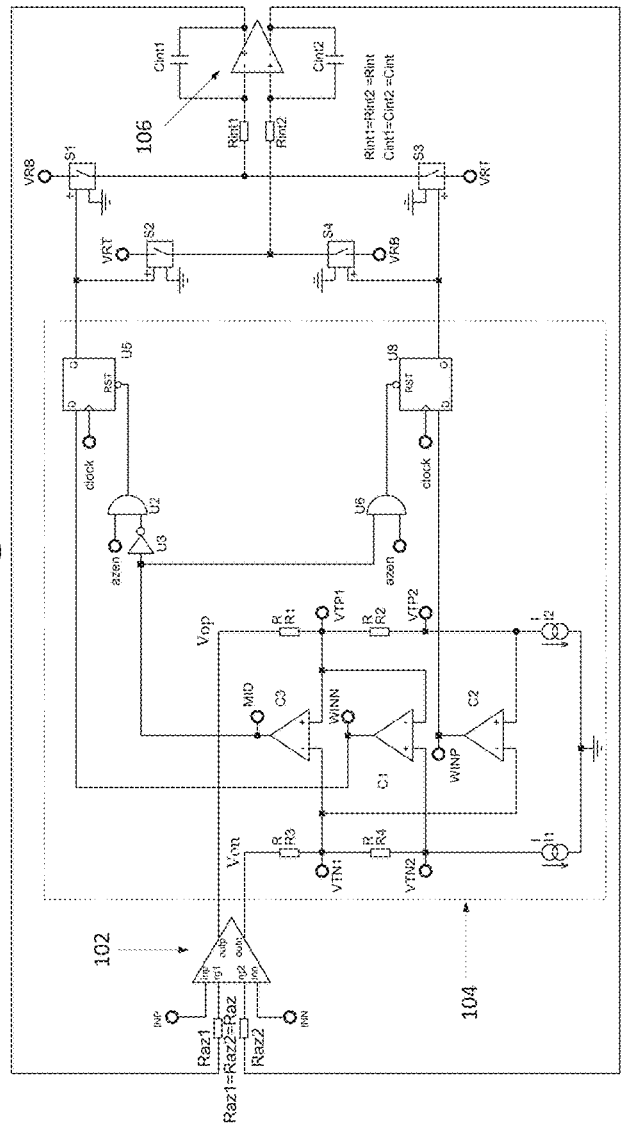
FIG. 1 is a block diagram illustrating an auto-zero differential amplifier (AZDA), according to an embodiment of the present invention.

FIG. 1 is a block diagram 100 illustrating an AZDA, according to an embodiment of the present invention. The AZDA reduces the offset in a differential amplifier using a negative feedback process. The AZDA may include, but is not limited to, a differential amplifier 102, a latched window comparator network 104, an integrator 106, reference voltages Vrt, Vrb, and switches S1, S2, S3, and S4.

Figure 2:
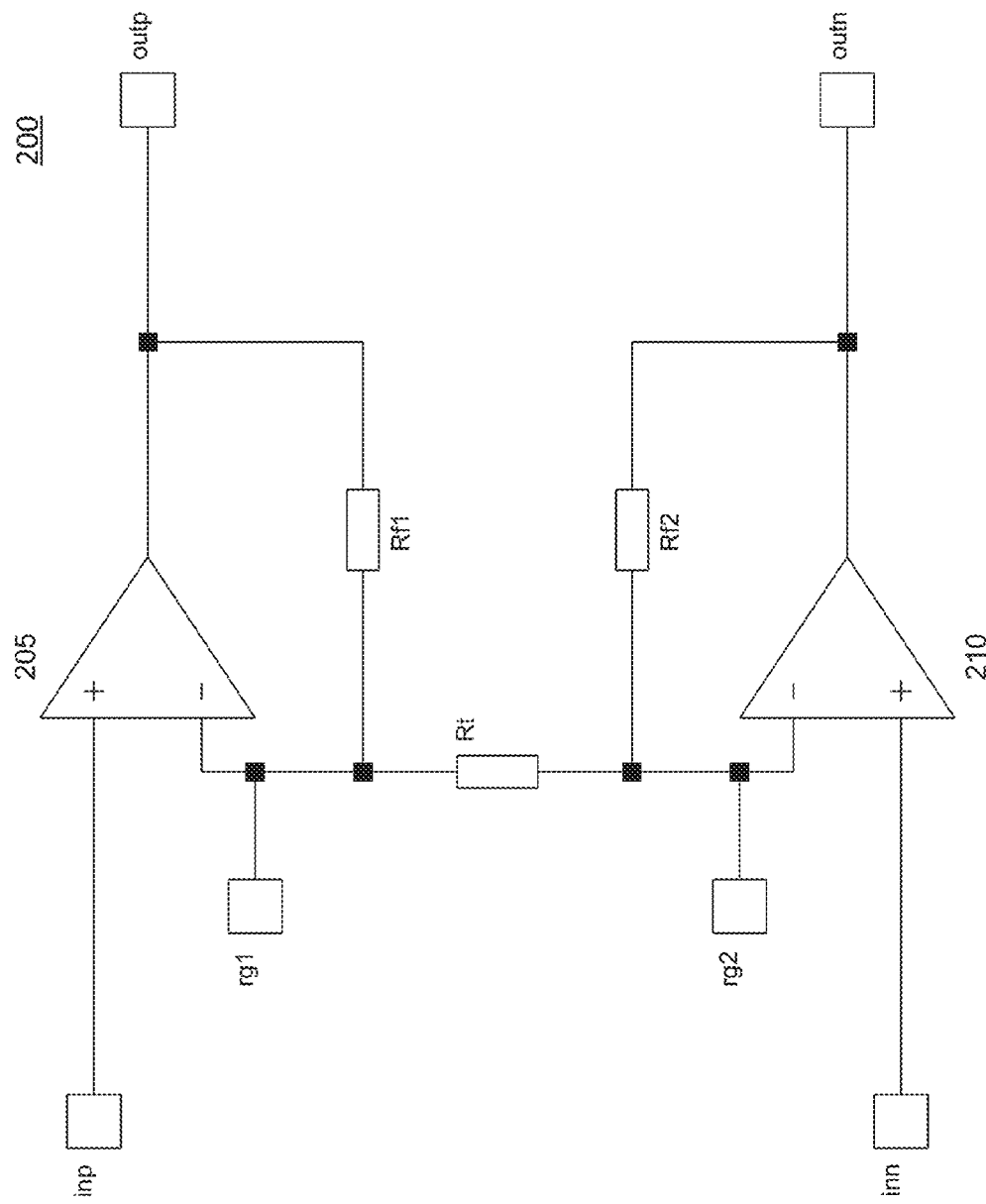
FIG. 2 is a simplified schematic illustrating an instrumentation amplifier with differential outputs, according to an embodiment of the present invention.

Differential amplifier 102 in this embodiment includes two high impedance positive and negative signal inputs (inp, inn), two virtual ground inputs (rg1, rg2) and two low impedance positive and negative outputs (outp, outn). This embodiment may also represent an instrumentation amplifier 200 topology albeit with differential outputs. See, for example, FIG. 2, which is a simplified schematic illustrating an instrumentation amplifier 200 with differential outputs outp, outn, according to an embodiment of the present invention. The differential amplifier 102 amplifies the difference between the signal inputs (inp, inn) and provides that amplified difference at the two outputs. The virtual ground inputs of differential amplifier 102 are driven differentially through equal valued resistors Raz1 and Raz2 (=Raz) by integrator 106 which supplies correction voltages to reduce the offset in a feedback process. Referring to FIG. 1 and FIG. 2, the differential and common mode output voltages (Vod, Vocm) are a function of the input voltages Vinp, Vinn, the feedback Rf1, Rf2 and termination Rt resistors and the auto-zero correction voltage Vaz and the auto-zero correction resistors Raz1, Raz2. The equations for the various output quantities are given below with the assumption of high open-loop gain in the amplifiers.

$$Voutp = Vinp\left(1 + \frac{Rf1}{Rt}\right) - Vinn\frac{Rf1}{Rt} - Vazp\frac{Rf1}{Raz1} \quad \text{Equation (1)}$$

-continued $$Voutn = -Vinp\frac{Rf2}{Rt} + Vinn\left(1 + \frac{Rf2}{Rt}\right) - Vazn\frac{Rf2}{Raz2} \quad \text{Equation (2)}$$

In one embodiment, resistors Rf1=Rf2=Rf, Raz1=Raz2=Raz, and voltages Vazp=Vaz and Vazn=–Vaz where Vaz is an offset correction voltage generated by the integrator:

$$Voutp = Vinp\left(1 + \frac{Rf}{Rt}\right) - Vinn\frac{Rf}{Rt} - Vaz\frac{Rf}{Raz} \quad \text{Equation (3)}$$

$$Voutn = -Vinp\frac{Rf}{Rt} + Vinn\left(1 + \frac{Rf}{Rt}\right) + Vaz\frac{Rf}{Raz} \quad \text{Equation (4)}$$

$$Vod = Vinp\left(1 + 2\frac{Rf}{Rt}\right) - Vinn\left(1 + 2\frac{Rf}{Rt}\right) - Vaz\frac{2Rf}{Raz} \quad \text{Equation (5)}$$

$$Vod = (Vinp - Vinn)\left(1 + 2\frac{Rf}{Rt}\right) - Vaz\frac{2Rf}{Raz} \quad \text{Equation (6)}$$

$$Vocm = \frac{Vinp + Vinn}{2} \quad \text{Equation (7)}$$

Raz in the above equations controls the sensitivity of the offset correction. In certain embodiments, the value of Raz would be larger than the value of Rf. The common mode output voltage equals the common mode input voltage if the inputs are balanced. The auto-zero correction voltage affects the differential output voltage, and ideally the correcting integrator 106 outputs are fully balanced. Differential amplifier 102 output voltages are fully balanced as long as the input voltages and correcting integrator output voltages are fully balanced. In practice, many sensors output only a single-ended signal with respect to a reference level so the differential amplifier's 102 outputs would not be fully balanced. In this embodiment, choosing different values for Rf1 and Rf2 can help restore balance if the inputs are not fully balanced.

The differential amplifier's 102 two outputs outp, outn are connected in some embodiments to a differential latched window comparator network 104, which drives three or more comparators. In one embodiment, the differential amplifier 102 outputs outp, outn can also directly connect to an ADC so that the difference may be digitized. In another embodiment, the differential amplifier 102 outputs outp, outn can directly connect to another amplifier or an integrator. In yet another embodiment, the differential amplifier 102 outputs outp, outn can drive a resistive or reactive load.

In some embodiments, there are two phases (phase 1 and phase 2) to the auto-zero process. In phase 1, for example, the logic input AZEN=1, and the auto-zero circuit is operating to generate corrective voltages out of integrator 106's outputs by charging/discharging capacitors Cint1 and Cint2. Also, in phase 1, the inputs INP and INN of differential amplifier 102 should ideally, but not necessarily, be equal to each other. In one embodiment, there may be a switch between the INP and INN inputs of differential amplifier 102. This switch may be closed during the offset correction phase 1 in some embodiments. In another embodiment, inputs INP and INN of differential amplifier 102 may not exactly be equal to one another but may be approximately equal to each other. In either case, the circuit may attempt to equalize the differential amplifier 102's outputs by a feedback process. An example of a sensor that would provide close but not exact values of inputs INP and INN is a thermopile sensor where the difference may only be microvolts.

In phase 2, for example, logic input AZEN=0, and the cumulative corrective actions that were stored on integrator 106's capacitors Cint1 and Cin2 are held and the auto-zero circuit corrects the differential amplifier 102's offset while the differential amplifier 102 is working to amplify the input signal. To those skilled in the art, this two phase correction scheme would be otherwise known as foreground correction because differential amplifier 102 outputs are being forced by the auto-zero loop to converge to within +–Q volts during phase 1. Differential amplifier 102 provides a response to the input signal only in phase 2 with the held corrective voltages applied to the rg1, rg2 inputs.

Latched window comparator network 104 may include comparators C1, C2, C3 to monitor the output offset of differential amplifier 102. For example, the junctions of resistors R1, R2 and R3, R4 comprise a differential resistor ladder, which drives comparators C1, C2, and C3. Comparators C1, C2, and C3 monitor the junctions of the resistors R1, R2 and R3, R4 to determine whether the output offset is positive or negative, and also whether the offset is beyond predefined thresholds. Output WINN from comparator C1 may indicate whether the output offset is negative, and output WINP from comparator C2 may indicate whether the output offset is positive. Resistors R1, R2, R3, and R4 may be of equal value R, and current sources I1 and I2 may be of equal value I.

In some embodiments, outputs WINN and WINP of window comparator network 104 are latched on the edge of a clock and drive (analog) integrator 106's differential output in a positive or negative direction. For example, latched window comparator network 104 feeds a signal to integrator 106, and the output (differential) of integrator 106 is fed back to reduce the offset of differential amplifier 102. Simply put, outputs of integrator 106 are fed back to secondary inputs (rg1, rg2) of differential amplifier 102, and in some embodiments, the output may send an adjustment current into a first stage feedback network of differential amplifier 102 to reduce the offset.

FIG. 3 illustrates an auto-zero window comparator principle 300, according to an embodiment of the present invention. In one or more embodiments, a window comparator network minimizes the effects of 'chatter' caused by near equal amplifier input voltages, which when combined with noise would cause a non-windowed comparator to output a series of logic ones and zeros with corresponding positive and negative corrective actions issuing from the integrator. The window comparator realizes hysteresis equal to ±Q volts. The noise may still effect the comparators in the window comparator network embodiment but the action may correct in one direction only or hold (with no correction) rather than correcting in both directions. The amount of hysteresis is controlled in certain embodiments by setting the value of Q with the bias current I.

In this embodiment, voltages Von and Vop are monitored in order to determine the difference. Ideally, in some embodiments, Vop minus Von should be zero or near zero. In certain embodiments, there may be window comparison levels: +Q, 0, and –Q volts. In this embodiment, Q stands for quantum, and is equal to a current I multiplied by a resistor value R. The current I can be variable when supplied from a current mode digital-analog converter (DAC) or other schemes. When the current I has the capability of being changed, the Q value can be changed allowing the user to adjust the magnitude of the corrected offset and the hysteresis.

Assume, for example, Q is 10 millivolts, then the window comparison levels would be plus or minus 10 millivolts around zero volts differential. In this example, auto-zero window comparator principle 300 may try to reduce the difference of Vop minus Von within the boundaries of plus or minus Q, when inputs to differential amplifier 102 are shorted to an arbitrary voltage within the common mode input range of the differential amplifier 102. If the offset is outside of plus or minus Q, the auto-zero window comparator principle 300 may correct the offset by feeding back a correction voltage or current into the differential amplifier 102.

In certain embodiments, a first comparator C1 monitors the difference between two particular taps on the resistor network, i.e., monitors voltage threshold negative 2 (Vtn2) connected to comparator C1's positive input and voltage threshold positive 1 (Vtp1) connected to comparator C1's negative input. Similarly, a second comparator monitors voltage threshold negative 1 (Vtn1) connected to comparator C2's negative input and voltage threshold positive 2 (Vtp2) connected to comparator C2's positive input. Similarly, a third comparator also monitors Vtn1 connected to comparator's C3's negative input and Vtp1 connected to comparator C3's positive input. Each comparator may work simultaneously in some embodiments. When, for example, first comparator C1 determines that Vtn2 minus Vtp1 is above a threshold, an action may be taken. Another action, opposite to that resulting from comparator C1's action, may be taken when second comparator C2 determines that Vtp2 minus Vtn1 is above the threshold. Comparator C3's role in some embodiments is an enabling function. For example, comparator C3 enables a correction action to be taken when the difference at its inputs is positive and an opposite correction action to be taken when the difference at its inputs are negative. Comparator C3's effect on the correction voltages is almost immediate while comparator C1's and C2's effects on the correction voltages are synchronized to a clock. The clock dependency of comparators C1 and C2's effects allows the differential amplifier 102 output voltage to continue to increase or decrease (i.e. to 'coast' or to slightly under or over-shoot the threshold voltage) for up to one clock cycle longer than if they were not gated by a clock which can result in a lower corrected offset voltage. When the output voltage crosses 0V differential, comparator C3 immediately suspends all corrective actions. The use of three comparators C1-C3 in this way allows a lower offset voltage to be realized after correction. Let's say, for example, the differential amplifier 102 offset was slightly higher than +10 mV. In such an example, both comparators C2 and C3 would output a logic one which would have a negative corrective action soon after the rising edge of the clock. For up to one clock cycle, the output would continue to coast negative, reducing the offset voltage even more until either the next clock rising edge or the output fell below 0V differential or, if the integrator slew rate was too high, −Q volts differential. The integrator slew rate or rate of change depends on the integrator input resistors (Rint1, Rint2) and feedback capacitors (Cint1, Cint2) and the values of the Vrt and Vrb reference voltages. In certain embodiments, Vrt and Vrb are programmable through DACs. The user can optimize the slew rate so as not to undershoot −Q volts or overshoot +Q volts by correctly setting the values of Vrt and Vrb.

In one embodiment, if Vtn2 minus Vtp1 is greater than 0, and Von is too high, then a command is sent to the integrator to increase Vop minus Von. In another embodiment, if Vtp2 minus Vtn1 is greater than 0, and if Vop is too high, then a command is sent to the integrator to decrease Vop minus Von. If, however, Vop minus Von is within the boundaries of plus or minus Q, a command is sent to the integrator to hold.

In a certain embodiment, the slew rate of the integrator may be programmed with two voltages—voltage reference top (Vrt) and voltage reference bottom (Vrb). The slew rate in these embodiments may control the offset correction speed. A high slew rate may result in a fast correction speed with a risk of overshoot, and a low slew rate may result in a slow correction speed with a lower risk of an overshoot. The slew rate of the correction voltage Vaz may be defined as $$\frac{dVaz}{dt} = \frac{Vrt - Vrb}{Cint \times Rint} \qquad \text{Equation (8)}$$

The voltage adjustment per clock cycle Tclock may be $$dVaz = T_{clock} \times \frac{Vrt - Vrb}{Cint \times Rint} \qquad \text{Equation (9)}$$

In certain embodiments, the differential output voltage of the differential amplifier may be monitored. For instance, if the differential output voltage is reduced to plus or minus Q volts, then the input referred offset is plus or minus Q volts divided by the original gain. This allows the input referred offset to be greatly reduced because the output offset is being sensed. Combining this technique with chopper stabilization may further reduce the offset. Simply put, the system attempts to reduce the offset of a differential system to zero.

In some embodiments, the system may operate on differential signal paths, and may operate with variable hysteresis. It should be appreciated that hysteresis is inherent to the operation, because the correction must exceed 2Q volts before the correction polarity is changed, minimizing the effects of chatter.

To prevent chatter, the system employs three comparators with comparison levels of plus Q, zero, and minus Q. Once the offset is below plus Q, the offset may never be corrected back up until the offset reaches minus Q. In other words, the system employs two Qs—plus Q and minus Q—of hysteresis.

The amount of hysteresis is some embodiments may be controlled. For example, the value I (value of the current) may be changed to control the amount of hysteresis. See, for example, FIG. 3, which shows Q being equal to IR. This also reduces the offset to within predefined limits.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
   a latched window comparator network configured to monitor an output offset of a differential amplifier; and
   an integrator configured to receive a signal from a latched window comparator network, and send an adjustment signal back to the differential amplifier to reduce an offset of the differential amplifier; wherein the latched window comparator network comprises
   two pairs of resistors configured to drive a plurality of comparators, which drive a plurality of latches through logic gates to control an integrator. wherein
   each of the comparators are configured to monitor paths of each of the plurality of resistors to determine whether the offset is positive or negative, and also whether the offset is beyond a predefined threshold.

2. The apparatus of claim 1, wherein the latched window comparator network is updated on an edge of a clock to drive the integrator.

3. The apparatus of claim 1, wherein the latched window comparator network is configured to monitor differential output voltage of the differential amplifier to determine if the differential output voltage is within a window comparison level.

4. The apparatus of claim 3, wherein the window comparison level comprises a plus quantum level, zero, and minus quantum level.

5. The apparatus of claim 4, wherein the plus quantum and minus quantum levels is defined by a current multiplied by a resistor value.

6. The apparatus of claim 3, wherein, when the differential output voltage of the differential amplifier is reduced to a plus or minus quantum (Q) level, then the offset input is plus or minus Q divided by an original gain, allowing the offset to be reduced.

7. An apparatus, comprising:
   a differential amplifier configured to amplify a difference between two input signals and provide the amplified difference;
   a differential window comparator network configured to determine if an offset of the amplified difference is positive or negative and if the offset is beyond predefined thresholds;
   a logic circuit comprising enabling gates and latches to hold the outputs of two or more of window comparators on an edge of a clock where at least one other comparator provides an enabling function to the enabling gates; and
   an integrator configured to transmit an adjustment current to the differential amplifier to reduce the offset of the amplified difference.

8. The apparatus of claim 7, wherein the differential amplifier comprises a first output and a second output connected to the differential window comparator network, connected to an analog to digital converter, another amplifier or integrator.

9. The apparatus of claim 7, wherein the differential window comparator network comprises a plurality of comparators to monitor the offset of the differential amplifier.

10. The apparatus of claim 9, wherein the compactors are further configured to monitor junctions of respective resistors to determine whether the offset is positive or negative and whether the offset is beyond a predefined threshold.

11. The apparatus of claim 10, wherein the predefined threshold comprises a positive threshold and a negative threshold.

12. The apparatus of claim 9, wherein the plurality of comparators comprises a first comparator configured monitor a voltage threshold negative 2 and a voltage threshold positive 1 to determine whether a correction action should be taken.

13. The apparatus of claim 9, wherein the plurality of comparators comprises a second comparator configured to monitor voltage threshold negative 1 and voltage threshold positive 2 to determine whether a correction action should be taken.

14. The apparatus of claim 9, wherein the plurality of comparators comprises a third comparator configured to perform a correction action when the offset of the amplified difference is positive or negative.

15. The apparatus of claim 7, wherein the differential window comparator network are latched on an edge of a clock to drive the integrator.

16. The apparatus of claim 7, wherein the integrator comprises a first output and a second output,
   the first output and the second output are respectively connected to a first secondary input and a second secondary input of the differential converter, allowing the adjustment voltage or current to the differential amplifier to reduce the offset of the amplified difference.

17. The apparatus of claim 7, wherein the integrator comprises a slew rate that depends on an input resistor of the integrator, a feedback capacitor of the integrator, values of top reference voltage, and bottom reference voltage.

18. The apparatus of claim 17, wherein the slew rate prevents undershooting the predefined threshold value or overshooting the predefined threshold.

19. An apparatus, comprising:
a differential amplifier configured to amplify a difference between two input signals;
a latched window comparator network configured to determine when an offset of the amplified difference is positive or negative, and when the offset is beyond predefined thresholds;
a logic circuit comprising enabling gates and latches to hold outputs of two or more of window comparators on an edge of a clock, and at least one other comparator to provide an enabling function to the enabling gates; and
an integrator driven from the latches in a closed loop with the differential amplifier and the latched window comparator network and configured to transmit an adjustment voltage or current to the differential amplifier to reduce the offset of the amplified difference in a first phase or a second phase; or
the integrator comprises a bidirectional counter to drive a digital to analog circuit (DAC) with differential outputs in a closed loop with the differential amplifier and latched window comparator network, and configured to transmit an adjustment voltage or current to the differential amplifier to reduce the offset of the amplified difference in a first phase or a second phase.

* * * * *